United States Patent
Boivin

(10) Patent No.: US 8,921,219 B2
(45) Date of Patent: *Dec. 30, 2014

(54) PROCESS FOR FABRICATING A TRANSISTOR COMPRISING NANOCRYSTALS

(71) Applicant: STMicroelectronics (Rousset) SAS, Rousset (FR)

(72) Inventor: Philippe Boivin, Venelles (FR)

(73) Assignee: STMicroelectronics (Roesset) SAS, Rousset (FR)

( * ) Notice: Subject to any disclaimer, the term of this patent is extended or adjusted under 35 U.S.C. 154(b) by 0 days.

This patent is subject to a terminal disclaimer.

(21) Appl. No.: 14/173,249

(22) Filed: Feb. 5, 2014

(65) Prior Publication Data

US 2014/0151781 A1   Jun. 5, 2014

Related U.S. Application Data

(62) Division of application No. 13/552,853, filed on Jul. 19, 2012, now Pat. No. 8,680,603.

(30) Foreign Application Priority Data

Jul. 21, 2011 (FR) ................................. 11 56606

(51) Int. Cl.
  H01L 21/3205 (2006.01)
  H01L 29/788 (2006.01)
  H01L 29/66 (2006.01)
  B82Y 10/00 (2011.01)
  H01L 21/28 (2006.01)
  H01L 29/423 (2006.01)
  H01L 27/115 (2006.01)

(52) U.S. Cl.
  CPC ............ *H01L 29/66825* (2013.01); *B82Y 10/00* (2013.01); *H01L 21/28273* (2013.01); *H01L 29/42332* (2013.01); *H01L 29/7885* (2013.01); *H01L 27/11521* (2013.01)
  USPC .......................................... 438/593; 257/315

(58) Field of Classification Search
  CPC .............. B82Y 10/00; H01L 21/28273; H01L 29/42332; H01L 29/7885; H01L 21/28282; H01L 21/02601; H01L 27/11521; H01L 27/11517; H01L 27/11563; H01L 29/66825
  USPC .......... 257/314, 315, 316; 977/932, 938, 940; 438/258, 264, 593
  See application file for complete search history.

(56) References Cited

U.S. PATENT DOCUMENTS

| | | | |
|---|---|---|---|
| 8,680,603 B2 * | 3/2014 | Boivin | ........................ 257/316 |
| 2006/0086970 A1 | 4/2006 | Kim | |
| 2007/0232041 A1 | 10/2007 | Choi et al. | |
| 2007/0262373 A1 | 11/2007 | Park et al. | |

FOREIGN PATENT DOCUMENTS

| | | |
|---|---|---|
| EP | 0506287 | 9/1992 |
| JP | 11163305 | 6/1999 |

OTHER PUBLICATIONS

Sze, "Semiconductor devices, physics and technology", 2002, pp. 193-195, 216, and 217, Figs. 19, 41, and 42.*

* cited by examiner

*Primary Examiner* — Nikolay Yushin
(74) *Attorney, Agent, or Firm* — Allen, Dyer, Doppelt, Milbrath & Gilchrist, P.A.

(57) ABSTRACT

A process for fabricating a transistor may include forming source and drain regions in a substrate, and forming a floating gate having electrically conductive nanoparticles able to accumulate electrical charge. The process may include deoxidizing part of the floating gate located on the source side, and oxidizing the space resulting from the prior deoxidation so as to form an insulating layer on the source side.

23 Claims, 4 Drawing Sheets

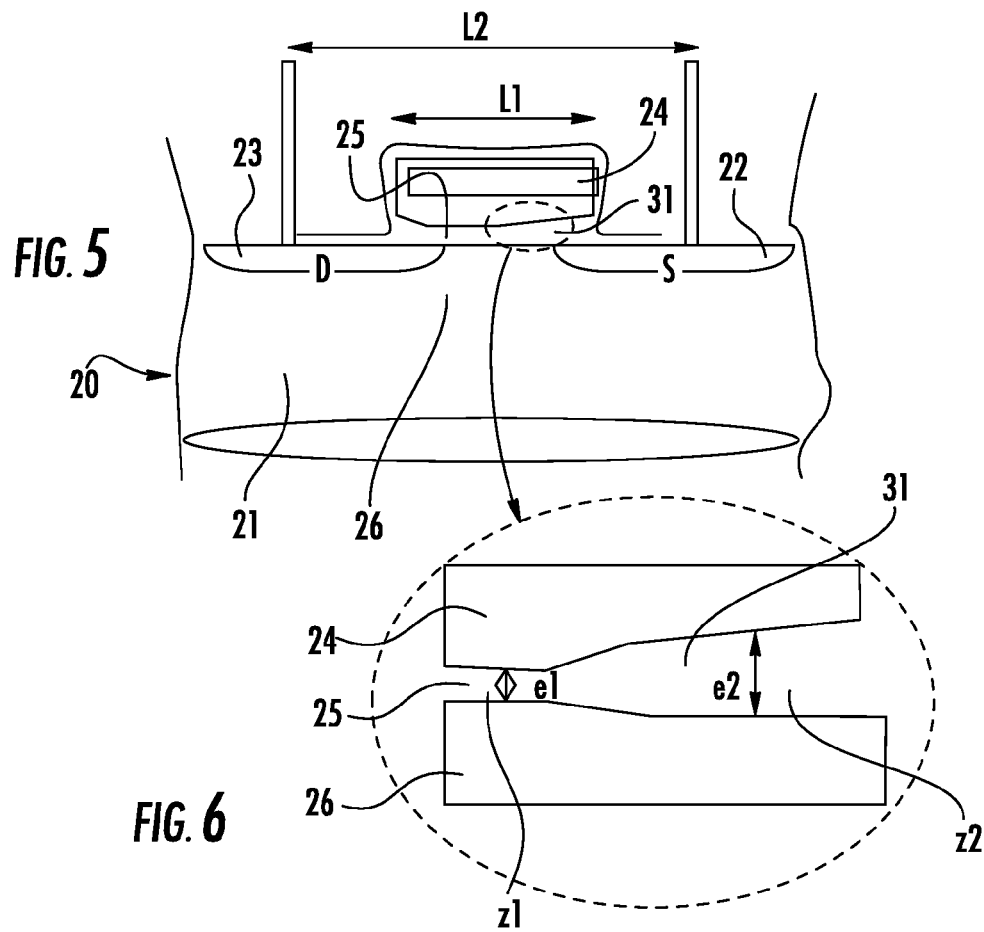
FIG. 5
FIG. 6
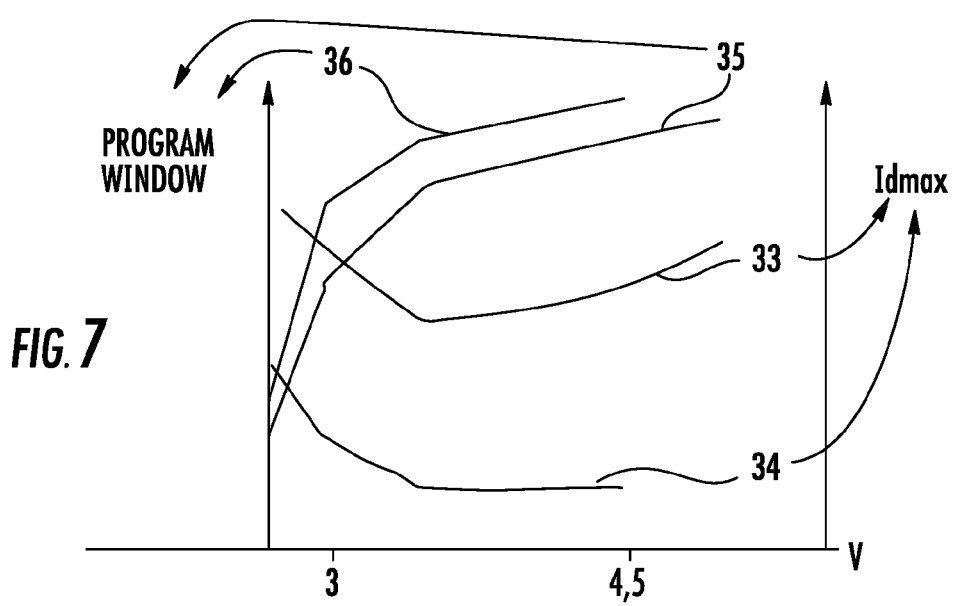
FIG. 7

PROCESS FOR FABRICATING A TRANSISTOR COMPRISING NANOCRYSTALS

FIELD OF THE INVENTION

The present invention relates to a transistor, an electrically programmable memory, and to an electronic device, and also to a process for making the transistor and the memory.

BACKGROUND OF THE INVENTION

Some uses of electrically programmable memories are highly constrained in terms of available space, as in the case for cards incorporating microprocessors, also called smart cards, or any integrated-circuit device on a semiconductor wafer. In addition, in contactless smart card applications, for example, little power may be available because such smart cards generally do not have an internal power supply and are powered remotely by an external reader. In this sort of application, low power consumption may be a second constraint.

In these applications, it is common to use flash memories, which have the advantage of a very simple and compact structure, providing a large storage capacity with a small footprint. However, programming these flash memories may require substantial voltages, which induce large leakage currents and overall high power consumption. Thus, these memories may fail to meet some requirements.

Actual flash memories are produced using metal oxide semiconductor (MOS) transistors. Programming of such transistors takes place in the presence of a high drain-source current and makes use of a mechanism for injecting electrical charge into the floating gate called "hot carrier injection." In contrast, the memory is erased by a tunneling effect (Fowler-Nordheim tunneling) by applying, to the transistors, voltages that extract the charge trapped in the floating gate, with a negligible flow of current between the drain and the source.

The typical hot-carrier-injection transistor has low injection efficiency, and may require a high programming current of about 50 µA per transistor. This property limits the number of transistors that can be programmed simultaneously in a memory, this number generally being equal to 8, 16, or 32 transistors. In low-consumption semiconductor products, the number of transistors that can be simultaneously programmed is furthermore limited by power-consumption constraints. Currently available approaches do not satisfactorily address these problems.

FIG. 1 is a cross-sectional view of a typical structure of a hot-electron-injection MOS transistor 10 comprising nanocrystals. This transistor 10 comprises a p-type substrate 1, n-type source (S) and drain (D) regions (2 and 3, respectively), a floating gate 8 made of a dielectric 11 in which electrically conductive nanoparticles 12 have been incorporated, for example, silicon or germanium nanocrystals, and a control gate 4. Each nanoparticle may act as an independent floating gate and is able to trap electrons. In the following, the expression "floating gate" will be used to denote the layer comprising all the nanocrystals of such a transistor. The control gate 4 is generally made of polysilicon (polycrystalline silicon). The control gate 4 and the source 2 and drain 3 regions are provided with electrical contacts, shown schematically. The floating gate 8 is electrically insulated from the substrate 1 and the control gate 4 by the dielectric 11. The conductive particles 12 of the floating gate 8 may accumulate electrical charge that modifies the threshold voltage of the transistor.

The transistor 10 is programmed by applying a positive voltage VD to the drain region 3, a positive voltage VCG to the control gate 4, a zero voltage VS (ground or GND) to the source region 2, and a zero or negative voltage to the substrate, these voltages being chosen so as to place the transistor into a saturated operating mode. The gate voltage VCG generates a vertical electric field EV. The electric field EV causes an inversion zone 5 to appear in the substrate 1, forming an n-type conductive channel in which electrons can flow and which has a pinch-off zone 6 neighboring the drain region 3. The drain-source potential difference generates a current IDS, between the drain region 3 and the source region 2, corresponding to a stream of electrons flowing in the opposite direction between the source region 2 and the drain region 3. At the pinch-off zone 6, the electrons have a high kinetic energy, thereby generating hot carriers, some of which overcome the potential barrier of the dielectric material 11 and penetrate into the nanocrystal zones 12 of the floating gate 8 where they remain trapped locally. The substrate region 1 lying between the pinch-off zone 6 and the drain region 3 is thus called the injection zone 7.

The electrical charge trapped in the nanocrystals of the floating gate 8 modifies the threshold voltage of the transistor. This threshold voltage may then be measured by a read amplifier that delivers as output a 0 or 1 logic value depending on whether the transistor is in the programmed state, i.e. electrons are present in the floating gate, or not (the unprogrammed state being called the erased state).

As indicated above, such a transistor structure 10 has a low injection efficiency, i.e. the ratio of the current IDS that flows during programming to the current that is injected into the nanocrystals, is low (the amount of electrical charge trapped being equal to the current injected multiplied by the injection time).

This low efficiency is a result of the vertical electric field EV being greatly attenuated near the injection zone 7. The field strength is high near the source region 2, but is gradually attenuated as it approaches the drain region 3 because it is neutralized by the drain voltage VD, thereby also causing pinch-off 6 of the channel.

Production of such a transistor generally comprises first producing an insulating layer, generally a silicon oxide layer, then depositing conductive nanoparticles, generally silicon nanocrystals, and then depositing a dielectric layer on the nanocrystals, which may be an oxide or an oxide/nitride/oxide trilayer. Next, a step of depositing and etching polycrystalline silicon allows the control gate 4 of the transistor to be formed. This gate then acts as a mask for forming the drain and source regions of the transistor.

SUMMARY OF THE INVENTION

An object may include providing a transistor that has a small footprint and low power consumption.

An aspect is directed to a process for fabricating a transistor that may comprise forming source and drain regions in a substrate and forming a floating gate comprising electrically conductive nanoparticles able to accumulate electrical charge. The process may comprise deoxidizing part of the floating gate located on the source side, and oxidizing the space resulting from the prior deoxidation so as to form an insulating layer on the source side. The deoxidizing step may comprise a wet etching method of the buffered oxide etch (BOE) type.

Another aspect is directed to a process for fabricating a programmable memory using the process for fabricating a transistor such as described above to fabricate a number of memory cells. The memory may be a flash memory, and the process may comprise a step of forming a self-aligned source by etching with the aid of a mask, this mask being likewise used for the deoxidizing step on the source side between a number of gates of a number of transistors and the substrate.

Another aspect is directed to a transistor comprising source and drain regions in a substrate, and at least one floating gate comprising electrically conductive nanoparticles able to accumulate electrical charge and a control gate. The space between the control gate and the substrate may comprise a first zone on the drain side, comprising electrically conductive nanoparticles able to accumulate electrical charge, and a second zone juxtaposed on the side of the source region comprising a single insulating layer. The second zone on the side of the source region may not comprise nanoparticles.

The first zone may have a smaller thickness than that of the second zone. The source may comprise a part located under the floating gate, possibly forming a junction with a channel region located between the drain region and the source region, and the second zone may extend beyond this junction.

The second zone may have a length of between 25% and 75% of the total gate length. The drain and source regions may be regions doped n-type or p-type, and the substrate may be a p-type or an n-type well. The transistor may be a hot-carrier-injection MOS transistor.

Another aspect is directed to a non-volatile electrically programmable memory that may comprise memory cells connected to word lines and bit lines, and a number of cells comprising at least one transistor such as described above. The memory may be of the flash or EEPROM type.

Another aspect is directed to an electronic device comprising at least one non-volatile electrically programmable memory as described above. The electronic device may be a contact or contactless smart card.

BRIEF DESCRIPTION OF THE DRAWINGS

These subjects, features and advantages of the present invention will be described in detail, in the following non-limiting description of a particular implementation, with regard to the appended figures in which:

FIG. 5 is a schematic diagram of a transistor, according to an embodiment of the present invention.

FIG. 6 is a schematic diagram of an enlarged view of part of the transistor, according to an embodiment of the present invention.

FIG. 7 is a diagram of the operation of a transistor, according to an embodiment of the present invention compared with a transistor, according to the prior art.

DETAILED DESCRIPTION OF THE PREFERRED EMBODIMENTS

Figure 1:
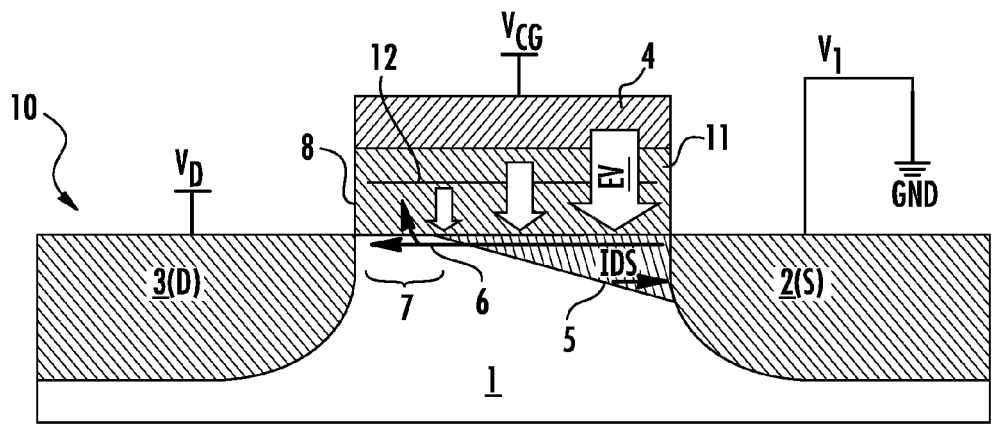
FIG. 1 is a schematic cross-sectional view of a transistor, according to the prior art.
Figure 2:
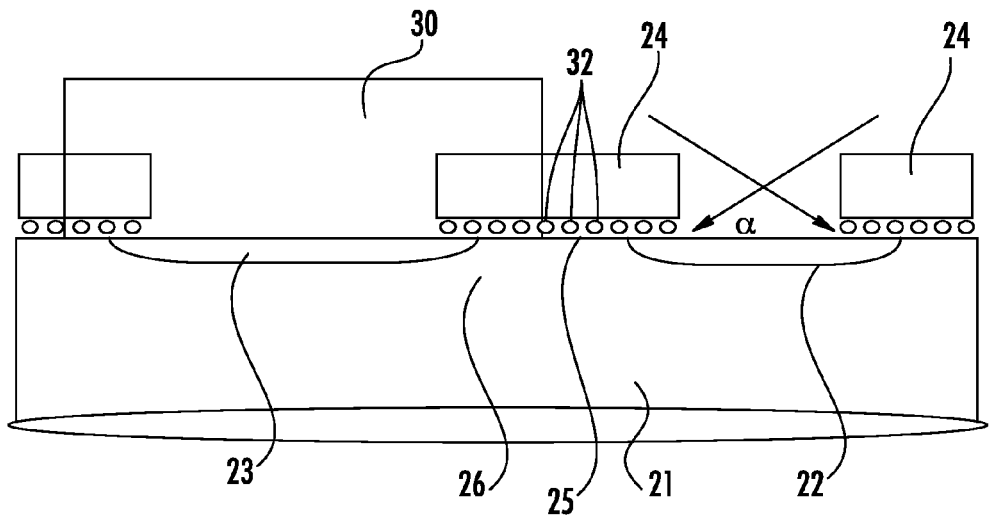
FIGS. 2 to 4 are schematic diagrams of a method for fabricating a transistor, according to one embodiment of the present invention.

FIG. 2 shows a semiconductor substrate 21 on which a number of transistors have been fabricated, distributed in rows and columns so as to form a flash memory according to the architecture described below with reference to FIG. 8.

Each transistor is therefore advantageously produced in an integrated circuit (IC) on a semiconductor chip. Naturally, the process described below applies to any number of transistors, even a single transistor, and any distribution or organization on an integrated-circuit wafer. It may also be applied to any other type of transistor comprising nanocrystals.

In the implemented process, source 22 and drain 23 regions, a floating gate 25 comprising electrically conductive nanoparticles 32, and a control gate 24 have been fabricated for each transistor using a typical method. The floating gate 25, comprising nanoparticles 32 (for example, nanocrystals), placed between the control gate 24 and the substrate 21 is then modified at the end of the fabrication process.

Figure 3:
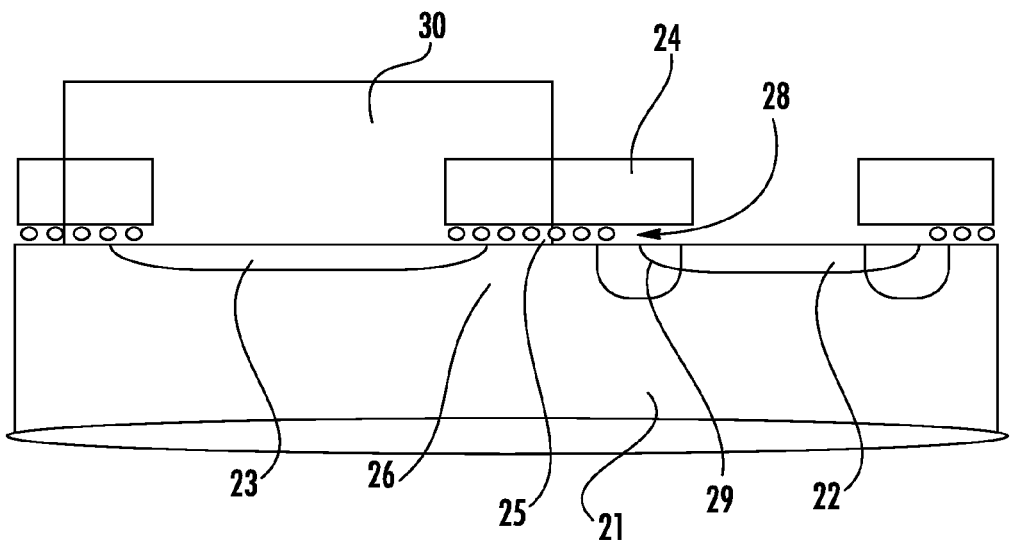
Figure 4:
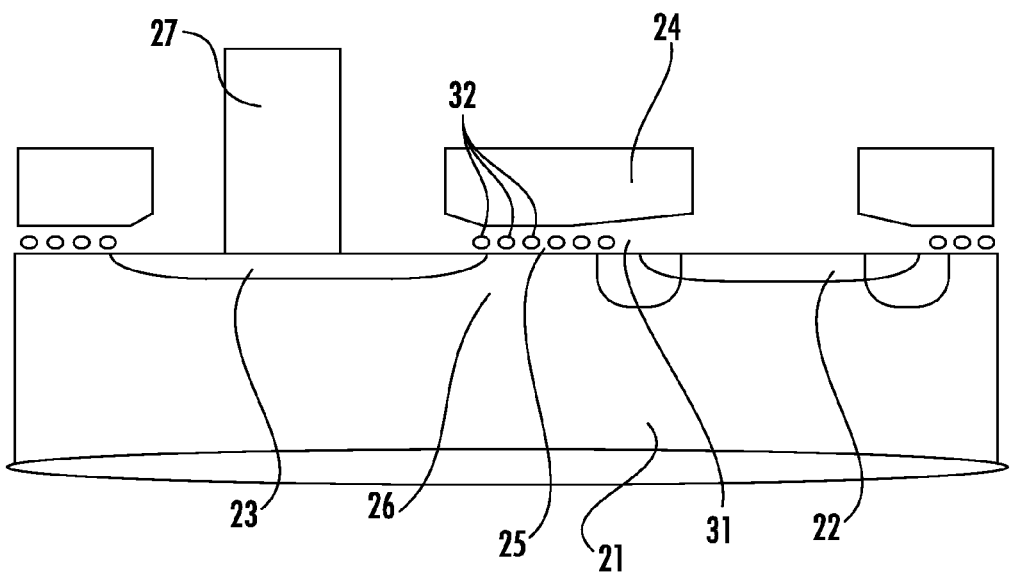

FIG. 2 shows an optional step of implantation into the source region. This implantation, which is optional, is carried out at an angle so as to locally over dope the channel. Next, a second step of deoxidizing part of the layer comprising the floating gate 25 next to the source 22 is implemented, which removes part of this layer. This step employs a wet etching method, for example, based on the known BOE method, a mask 30, possibly made of a protective resist, having been previously deposited so as to protect the other zones of the transistor, in particular the drain. The result of this deoxidizing step is shown in FIG. 3, an empty zone 28 being located between the control gate 24 and the substrate 21 and/or the source region 22 on the source 22 side, the empty zone extending beyond the junction 29, between the source 22 and the channel 26 intermediate between the source 22 and the drain 23.

It should be noted that this step therefore requires a mask 30. However, in the context of a process for fabricating a flash memory, comprising a step of forming a self-aligned source (SAS), the mask used for etching of the source lines may be used for this deoxidizing step: there is then no need to add an additional mask to implement the solution according to the embodiment. Next, the resist forming the mask 30 is removed, and an oxidation step (of the polyoxidation type) is carried out, which allows the space 28 to be reoxidized by forming a single insulating layer 31, which extends continuously from the floating gate 25 comprising nanocrystals. However, this added insulating layer 31 does not comprise nanocrystals. This figure shows the final result obtained by these steps of the fabrication process.

This fabrication process allows the nanocrystals 32 intended to trap electrical charge to be distributed near the drain 23 and far from the source 22, this is an advantageous configuration that increases the performance of the transistor. This is because it removes the nanocrystals that are not useful to the operation of the transistor in its electrical programming function.

Moreover, the process used also makes it possible to obtain the desired form of the layer 31 separating the control gate 24 from the substrate 21, in a precise manner, with a precision greater than 2 nanometers. It thus allows fabrication of a transistor having a shorter total length L2, which depends on the technology chosen, and a control gate 24 length L1 that may be 40 nanometers or less. The process thus allows transistors having a much shorter total length to be fabricated while preserving a power consumption equivalent to that of typical transistors, or it makes it possible to obtain a transistor of equivalent size but with reduced power consumption. The user will therefore choose the best compromise between power consumption and transistor footprint depending on the particular application envisioned.

FIG. 5 shows the hot-electron-injection MOS transistor 20 obtained by the fabrication process described above. This transistor comprises a p-type substrate 21, n-type source S and drain D regions (22 and 23, respectively), and a control gate 24. The space lying between this control gate 24 and the substrate 21 comprises a first zone z1 on the drain 23 side, forming a floating gate 25 comprising conductive nanoparticles (not shown), and a second zone z2 on the source 22 side forming a nanoparticle-free insulating layer 31. It should be noted that this process makes it possible to completely fill the space extending from the upper surface of the substrate 21 to the lower surface of the control gate 24 with a single layer 31 of insulating material, on the source side. The control gate 24 is electrically insulated from the substrate 21 by the insulators of the intermediate layers 25, 31 of the two juxtaposed zones z1, z2. These two zones may have substantially the same length i.e. about ½ L1. In another embodiment, the length of the zone z2 is between 25% and 75% of the total gate length L1, i.e. the total length of the zones z1, z2 and z3.

The drain and the source are separated by a space forming a channel 26 in which electrons flow in the programming phase of the transistor, in accordance with the principle described above. The nanoparticles may be incorporated into the electrical material filling the space between the control gate and the substrate or be incorporated in a different dielectric. In another embodiment, the transistor could have an n-type substrate and p-type source and drain regions.

As may be seen in FIG. 6, the space between the substrate 21 and the control gate 24 varies in thickness in this embodiment. More precisely, it has a larger thickness e2 in the second zone z2 on the source 22 side, where the insulator 31 added in the oxidation step is located, and a smaller thickness e1 in the first zone z1 on the drain 23 side, where the nanoparticles are located in the dielectric. As a variant, these two thicknesses could be the same or e2 could be smaller than e1. By way of example, the nanoparticles can be incorporated in a dielectric layer of thickness e1 lying between 8 and 60 nanometers, or advantageously between 10 and 25 nanometers.

The geometry shown in FIG. 6 has the effect of obtaining a vertical electric field that varies at the channel 26 during a transistor-programming operation, the electric field in particular increasing towards the drain since such an electric field is inversely proportional to the distance between the control gate 24 and the substrate 21. Thus, the end result of this effect is to increase the coupling factor of the transistor and reduce its power consumption. In addition, the absence of nanoparticles on the source side promotes electron trapping in the most advantageous zone.

FIG. 7 shows two curves 35, 36 illustrating the program window of two MOS transistors, of the typical approach, and according to an embodiment of the invention, respectively, and two curves 33, 34 illustrating the current Id that flows for the same transistors as a function of the applied drain voltage Vd. These curves show that for the same program window, the power consumption of the transistor according to the embodiment is clearly lower than that of the typical transistor, about more than 20% less, even close to 50% less.

Naturally, the method described above may be used to fabricate any type of transistor comprising an insulating layer, a gate comprising nanocrystals and source and drain zones. The transistor described above, and the fabrication process described above, may allow production of an advantageous electrically programmable memory, since it has a small footprint and requires little current for its programming.

Figure 8:
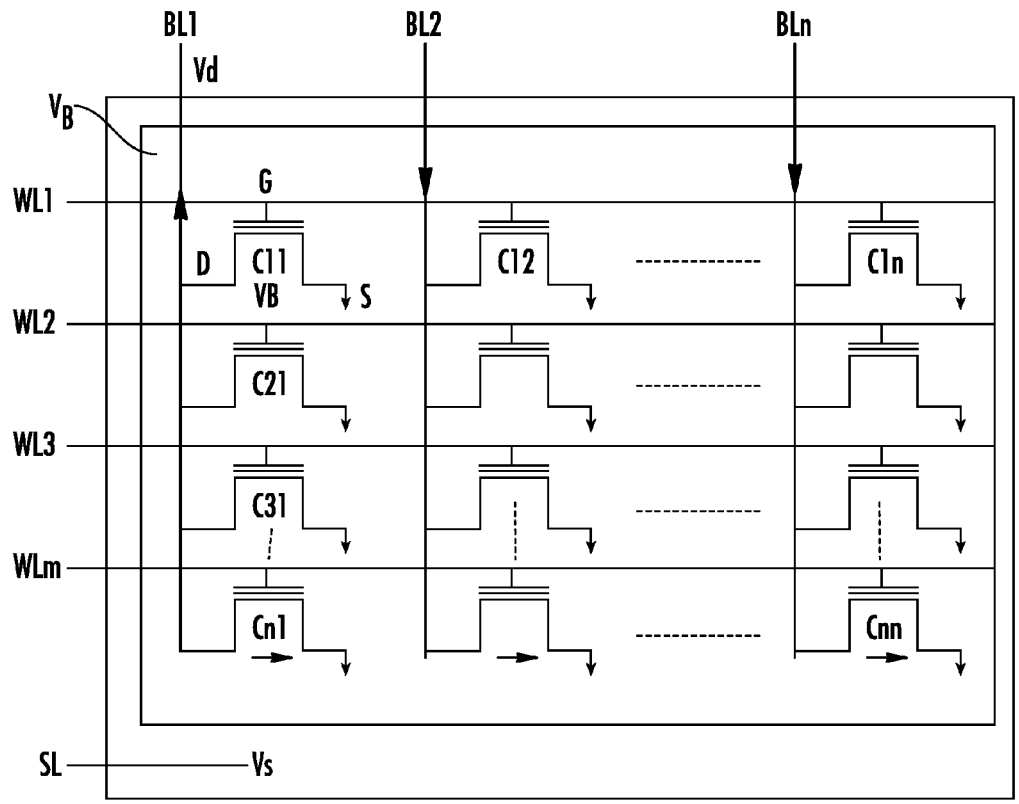
FIG. 8 is a schematic diagram of a flash memory comprising a transistor, according to an embodiment of the present invention.

In particular, FIG. 8 shows a segment of a NOR-type flash memory according to one implementation. It comprises n×m cells Cij organized in rows and columns, each cell being located at the intersection of a word line WLi and a bit line BLj. Each cell Cij comprises a transistor with a floating gate comprising nanocrystals, such as described above, having its gate G connected to the word line WLi and its drain D connected to the bit line BLj. All the cells have their source S connected to the same source line SL.

Figure 9:
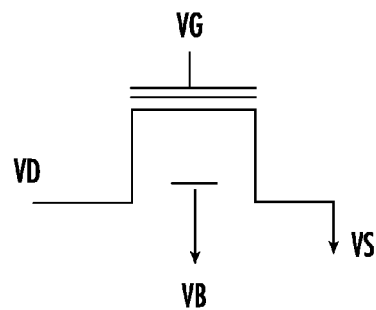
FIG. 9 illustrates the electrical symbol of a transistor, according to an embodiment of the present invention.

The architecture described above makes it possible to implement an advantageous method for programming the memory segment. Specifically, if it is desired to program the cells thereof, it is proposed to set the potential VD of its drain D, connected to a bit line, to 3.8 V, or more generally to between 3.5 and 4.5 V, the potential of its source VS to 0 V, and the potential of its well (or substrate) VB to a negative or zero value, for example, −0.5 V, or more generally to between 0 and −1.5 V, and the control gate voltage VG to between 8 and 9 V, inclusively. FIG. 9 shows a transistor and its various terminals and potentials. Naturally, the aforementioned numerical values are given by way of example. The technical effect of reduced power consumption compared to typical transistors would be obtained with any other values.

The fact that power consumption is reduced while the memory density remains very high, for a flash memory such as described above, may enable an advantageous implementation within any integrated circuit on a semiconductor chip, and in any portable device such as a smart card, and in particular in contactless devices such as contactless smart cards. Furthermore, the transistor described above may also be used to form other types of electrically programmable memory, such as EEPROM, in integrated circuits on semiconductor chips.

That which is claimed is:

1. A method for making a transistor comprising:
   forming source and drain regions in a substrate;
   forming a floating gate comprising a plurality of electrically conductive nanoparticles to accumulate electrical charge;
   deoxidizing a part of the floating gate adjacent the source region to define a space; and
   oxidizing the space to form an enlarged zone of an insulating layer adjacent the source region.

2. The method according to claim 1 wherein deoxidizing comprises buffered oxide etching (BOE).

3. The method according to claim 1 wherein the transistor is for an electrically programmable memory comprising a plurality of memory cells.

4. The method according to claim 3 wherein the electrically programmable memory comprises a flash memory; and further comprising forming a self-aligned source by etching with a mask, the mask being used for deoxidizing on a source side between a number of gates of a number of transistors and the substrate.

5. A method for making a transistor comprising:
   forming source and drain regions in a substrate;
   forming a floating gate comprising a plurality of electrically conductive nanoparticles to accumulate electrical charge;
   removing a part of the floating gate adjacent the source region; and
   forming an enlarged zone of an insulating layer adjacent the source region and in the removed part of the floating gate.

6. The method according to claim 5 wherein removing comprises buffered oxide etching (BOE).

7. The method according to claim 5 wherein the transistor is for an electrically programmable memory comprising a number of memory cells.

8. A transistor comprising:
   a substrate;
   source and drain regions in said substrate;
   a control gate above said substrate;

a first zone adjacent said drain region and between said substrate and said control gate, and comprising at least one floating gate including a plurality of electrically conductive nanoparticles configured to accumulate electrical charge;

a second zone adjacent said source region and between said substrate and said control gate, and comprising a single insulating layer, the first zone having a thickness less than that of the second zone and configured to provide a vertical electric field that varies across the first and second zones during a transistor-programming operation; and a transition zone between said first and second zones and having a thickness transitioning from the thickness of the first zone to the thickness of the second zone, the second zone extending from said transition zone to the source region and also increasing in thickness from said transition zone to the source region.

9. The transistor according to claim 8 wherein said second zone is devoid of conductive nanoparticles.

10. The transistor according to claim 8 further comprising a channel region between said source region and said drain region; wherein said source region is partially under said control gate and defines a junction with said channel region between said drain region and said source region; and wherein said second zone extends beyond the junction.

11. The transistor according to claim 8 wherein said second zone has a length between 25% and 75% of a total gate length.

12. The transistor according to claim 8 wherein said drain and source regions each comprises a region having a first conductivity type; and wherein said substrate has a second conductivity type opposite the first conductivity type.

13. The transistor according to claim 10 wherein said channel region is configured to permit hot-carrier-injection.

14. A non-volatile electrically programmable memory comprising:
 a plurality of memory cells coupled to at least one word line and to at least one bit line, each memory cell comprising at least one transistor comprising
  a substrate,
  source and drain regions in said substrate,
  a control gate above said substrate,
  a first zone adjacent said drain region and between said substrate and said control gate, and comprising at least one floating gate including a plurality of electrically conductive nanoparticles configured to accumulate electrical charge,
  a second zone adjacent said source region and between said substrate and said control gate, and comprising a single insulating layer, the first zone having a thickness less than that of the second zone and configured to provide a vertical electric field that varies across the first and second zones during a transistor-programming operation for each memory cell, and
  a transition zone between said first and second zones and having a thickness transitioning from the thickness of the first zone to the thickness of the second zone, the second zone extending from said transition zone to the source region and also increasing in thickness from said transition zone to the source region.

15. The non-volatile electrically programmable memory according to claim 14 where said plurality of memory cells comprises a plurality of flash memory cells.

16. The non-volatile electrically programmable memory according to claim 14 where said plurality of memory cells comprises a plurality of Electrically Erasable Programmable Read-Only Memory (EEPROM) memory cells.

17. The non-volatile electrically programmable memory according to claim 14 wherein said at least one transistor further comprises a channel region between said source region and said drain region; wherein said source region is partially under said control gate and defines a junction with said channel region between said drain region and said source region; and wherein said second zone extends beyond the junction.

18. The non-volatile electrically programmable memory according to claim 14 wherein said second zone has a length between 25% and 75% of a total gate length.

19. The non-volatile electrically programmable memory according to claim 14 wherein said drain and source regions each comprises a region having a first conductivity type; and wherein said substrate has a second conductivity type opposite the first conductivity type.

20. An electronic device comprising:
 a device comprising a plurality of memory cells coupled to at least one word line and to at least one bit line, each memory cell comprising at least one transistor comprising
  a substrate,
  source and drain regions in said substrate,
  a control gate above said substrate,
  a first zone adjacent said drain region and between said substrate and said control gate, and comprising at least one floating gate including a plurality of electrically conductive nanoparticles configured to accumulate electrical charge,
  a second zone adjacent said source region and between said substrate and said control gate, and comprising a single insulating layer, the first zone having a thickness less than that of the second zone and configured to provide a vertical electric field that varies across the first and second zones during a transistor-programming operation for each memory cell, and
  a transition zone between said first and second zones and having a thickness transitioning from the thickness of the first zone to the thickness of the second zone, the second zone extending from said transition zone to the source region and also increasing in thickness from said transition zone to the source region.

21. The electronic device according to claim 20 wherein said device comprises a smart card.

22. The electronic device according to claim 20 where said plurality of memory cells comprises a plurality of flash memory cells.

23. The electronic device according to claim 20 where said plurality of memory cells comprises a plurality of Electrically Erasable Programmable Read-Only Memory (EEPROM) memory cells.

* * * * *